US011493842B2

(12) United States Patent
Jiang et al.

(10) Patent No.: US 11,493,842 B2
(45) Date of Patent: Nov. 8, 2022

(54) PHOTOMASK WITH ELECTROSTATIC DISCHARGE PROTECTION

(71) Applicant: Yangtze Memory Technologies Co., Ltd., Wuhan (CN)

(72) Inventors: Peng Jiang, Wuhan (CN); Yuping Mu, Wuhan (CN); Hong Fang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 772 days.

(21) Appl. No.: 16/292,230

(22) Filed: Mar. 4, 2019

(65) Prior Publication Data

US 2020/0233298 A1  Jul. 23, 2020

Related U.S. Application Data

(63) Continuation of application No. PCT/CN2019/072122, filed on Jan. 17, 2019.

(51) Int. Cl.
*G03F 1/40* (2012.01)
*G03F 1/36* (2012.01)

(52) U.S. Cl.
CPC . *G03F 1/40* (2013.01); *G03F 1/36* (2013.01)

(58) Field of Classification Search
CPC ................. G03F 1/40; G03F 1/36; G03F 1/38
See application file for complete search history.

(56) References Cited

U.S. PATENT DOCUMENTS

| | | | |
|---|---|---|---|
| 6,291,114 B1* | 9/2001 | Reijers | G03F 1/40 430/5 |
| 6,365,303 B1 | 4/2002 | Hung | |
| 6,372,390 B1 | 4/2002 | Liu | |
| 2003/0213612 A1 | 11/2003 | Wu | |
| 2007/0066006 A1 | 3/2007 | Kuo | |

FOREIGN PATENT DOCUMENTS

| | | |
|---|---|---|
| CN | 1319783 A | 10/2001 |
| CN | 1459667 A | 12/2003 |
| CN | 104332466 A | 2/2015 |
| CN | 205374980 U | 7/2016 |
| CN | 108107671 A | 6/2018 |
| JP | 63-265246 A | 11/1988 |
| JP | 5-100410 A | 4/1993 |
| JP | 2000-98592 A | 4/2000 |
| JP | 2002-55438 A | 2/2002 |
| JP | 2002-532758 A | 10/2002 |
| JP | 2006-133519 A | 5/2006 |
| JP | 2008241921 A | 10/2008 |
| KR | 10-2016-0025302 A | 3/2016 |
| TW | 543178 B | 7/2003 |
| TW | 200625000 | 7/2006 |
| WO | 00/36468 | 6/2000 |

* cited by examiner

Primary Examiner — Daborah Chacko-Davis
(74) Attorney, Agent, or Firm — Winston Hsu

(57) ABSTRACT

The present invention provides a photomask including a substrate, a circuit pattern on the substrate, an electrostatic discharge (ESD) ring on the substrate and an ESD line on the substrate. The ESD structure surrounds the circuit pattern. The ESD line extends between an edge of the substrate and the ESD structure, in which the ESD line includes an edge portion extending beyond an end of an edge of the ESD structure, and the edge portion of the ESD line includes at least one comb-shaped structure.

19 Claims, 15 Drawing Sheets

PHOTOMASK WITH ELECTROSTATIC DISCHARGE PROTECTION

CROSS REFERENCE TO RELATED APPLICATIONS

This application is a continuation of International Application No. PCT/CN 2019/072122 filed Jan. 17, 2019, the entire contents of which are incorporated herein by reference.

BACKGROUND OF THE INVENTION

1. Field of the Invention

The present invention relates to a photomask, and more particularly to a photomask with electrostatic discharge (ESD) protection.

2. Description of the Prior Art

Photolithography process in semiconductor manufacturing includes a process to pattern a photoresist. In this process, the photoresist is disposed on a wafer and exposed by a light through a reticle or a photomask. The photomask includes a design pattern having main features formed according to a design layout of integrated circuits, so after the exposure, the photoresist can be developed to form a projected pattern therein same as the design pattern of the photomask. For this reason, the photomask is one of key factors for achieving good pattern transfer.

Refer to FIG. 1, which illustrates a top view of a prior art photomask. As shown in FIG. 1, the prior art photomask 10 includes a circuit pattern 12 and an electrostatic discharge (ESD) ring 14 surrounding the circuit pattern 12, and the circuit pattern 12 and the ESD ring 14 are made of conductive material. Because of the ESD ring 14, some electric charges can be released or discharged, and the circuit pattern 12 can be protected from a certain degree of ESD damage.

However, the protection of the ESD ring is not enough. For example, in order to avoid particles or dust staying on the photomask while performing the photolithography process, the photomask usually will be picked by a mask holder or an operator for particle inspection. Since the photomask may be picked for a number of times, the electric charges will accumulates on the photomask through the frequent contact of the mask holder, and ESD effect, such as ESD arcing, still easily occurs, especially at the ESD ring or a portion of the circuit pattern near the edge of the photomask that the mask holder contact. Accordingly, portions of the circuit pattern where ESD happens are changed and distorted, for example an edge of the circuit pattern becomes bright, a corner of the circuit pattern is peeled, or a portion of the circuit pattern is damaged by ESD arc. Therefore, to keep the pattern of the photomask accurate is an important object in this field.

SUMMARY OF THE INVENTION

Embodiments of a photomask with electrostatic discharge protection are described in the present invention.

In some embodiments, a photomask is disclosed. The photomask includes a substrate, a circuit pattern on the substrate, an electrostatic discharge (ESD) structure on the substrate and an ESD line on the substrate. The ESD structure surrounds the circuit pattern. The ESD line extends between an edge of the substrate and the ESD structure, in which the ESD line includes an edge portion extending beyond an end of an edge of the ESD structure, and the edge portion of the ESD line includes at least one comb-shaped structure.

In some embodiments, the comb-shaped structure comprises a connecting part and at least two pins protruded from the connecting part.

In some embodiments, the edge portion includes a plurality of segments and a plurality of comb-shaped structures, each comb-shaped structure comprises a connecting part and at least two pins, and each segment and each connecting part are connected alternately to form a serpentine shape. The serpentine shape has a plurality of concavities, and the pins of one of the comb-shaped structure point toward one of the concavities.

In some embodiments, a depth of each concavity is greater than a length of each pin.

In some embodiments, the pins in adjacent two of the comb-shaped structures protrude toward opposite directions.

In some embodiments, the pins in adjacent two of the comb-shaped structures protrude toward the edge of the substrate.

In some embodiments, the ESD line further includes a main portion and another edge portion, the main portion is connected between the edge portions, and the another edge portion is disposed beyond another end of the edge of the ESD structure.

In some embodiments, the main portion includes a plurality of segments and a plurality of comb-shaped structures, and each segment and each comb-shaped structure are connected alternately to form a serpentine shape. The serpentine shape has a plurality of concavities arranged along an extending direction of the ESD line, and each comb-shaped structure of the main portion comprises a connecting part and at least two pins protruded from the connecting part to one of the concavities.

In some embodiments, the photomask further includes another ESD line disposed at a side of the ESD structure opposite to the edge.

In some embodiments, the ESD line surrounds the ESD structure.

In some embodiments, a length of the ESD line in an extending direction of the edge of the ESD structure is greater than a length of the ESD structure in the extending direction of the edge of the ESD structure.

In some embodiments, a width of the ESD line is less than a width of the ESD structure. In some embodiments, a width of the ESD line is more than a width of the ESD structure.

In some embodiments, an extending direction of the ESD line is parallel to an extending direction of the edge of the ESD structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present invention and, together with the description, further serve to explain the principles of the present invention and to enable a person skilled in the pertinent art to make and use the present invention.

Figure 1:
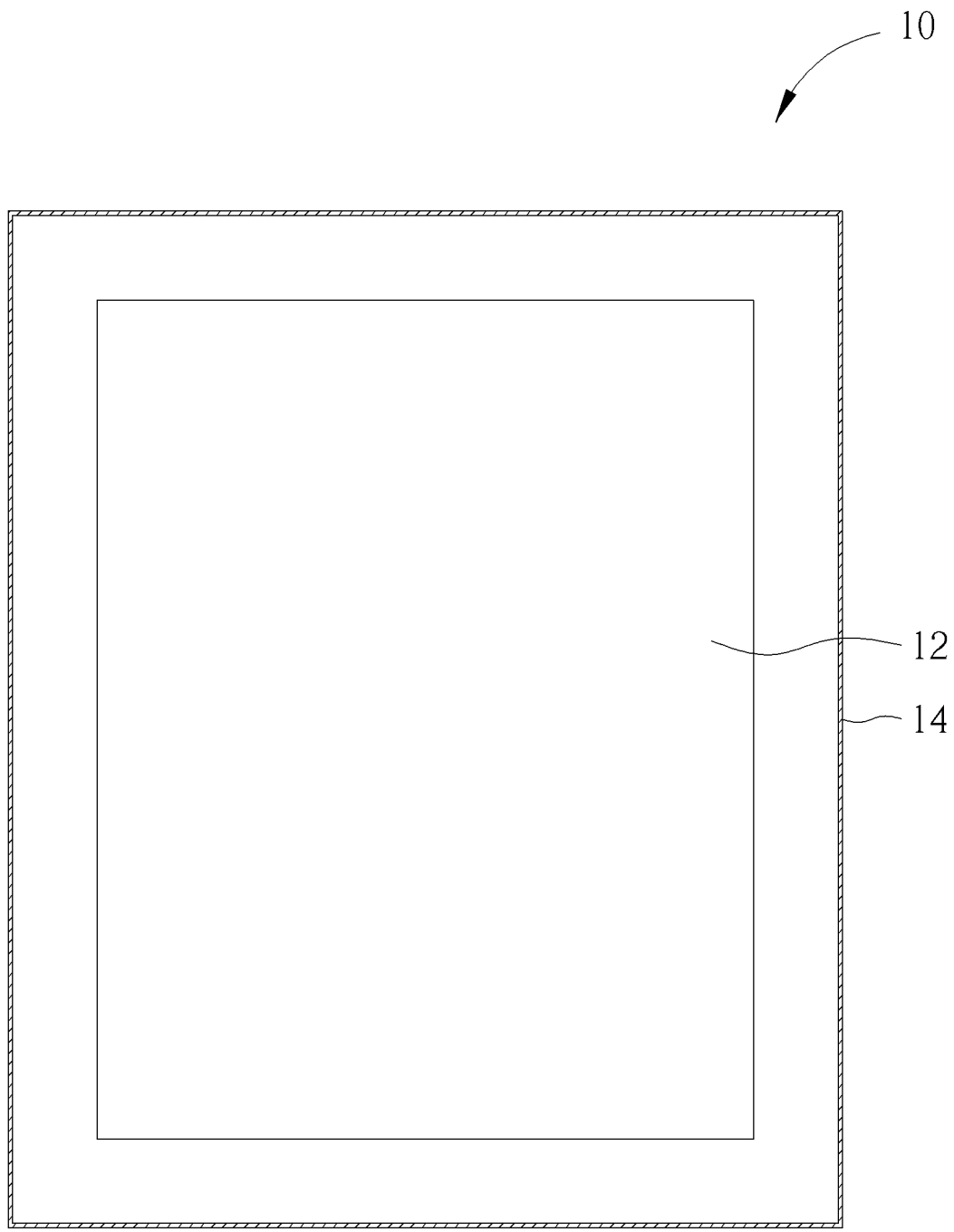
FIG. 1 illustrates a top view of a prior art photomask.

Embodiments of the present invention will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that the present invention can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present invention should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can be made from a transparent substrate material, such as glass, plastic, quartz or sapphire.

As used herein, the term "substantially" refers to a desired, or target value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject photomask structure. Based on the particular technology node, the term "about" can indicate a value of a given quantity that varies within, for example, 10-30% of the value (e.g., ±10%, ±20%, or ±30% of the value).

As used throughout this application, the word "may" is used in a permissive sense (e.g., meaning having the potential to), rather than the mandatory sense (e.g., meaning must). The words "include", "including", and "includes" indicate open-ended relationships and therefore mean including, but not limited to. Similarly, the words "have", "having", and "has" also indicated open-ended relationships, and thus mean having, but not limited to. The terms "first", "second", "third," and so forth as used herein are meant as labels to distinguish among different elements and may not necessarily have an ordinal meaning according to their numerical designation.

In the present invention, different technical features in different embodiments described in the following description can be combined, replaced, or mixed with one another to constitute another embodiment.

Figure 2:
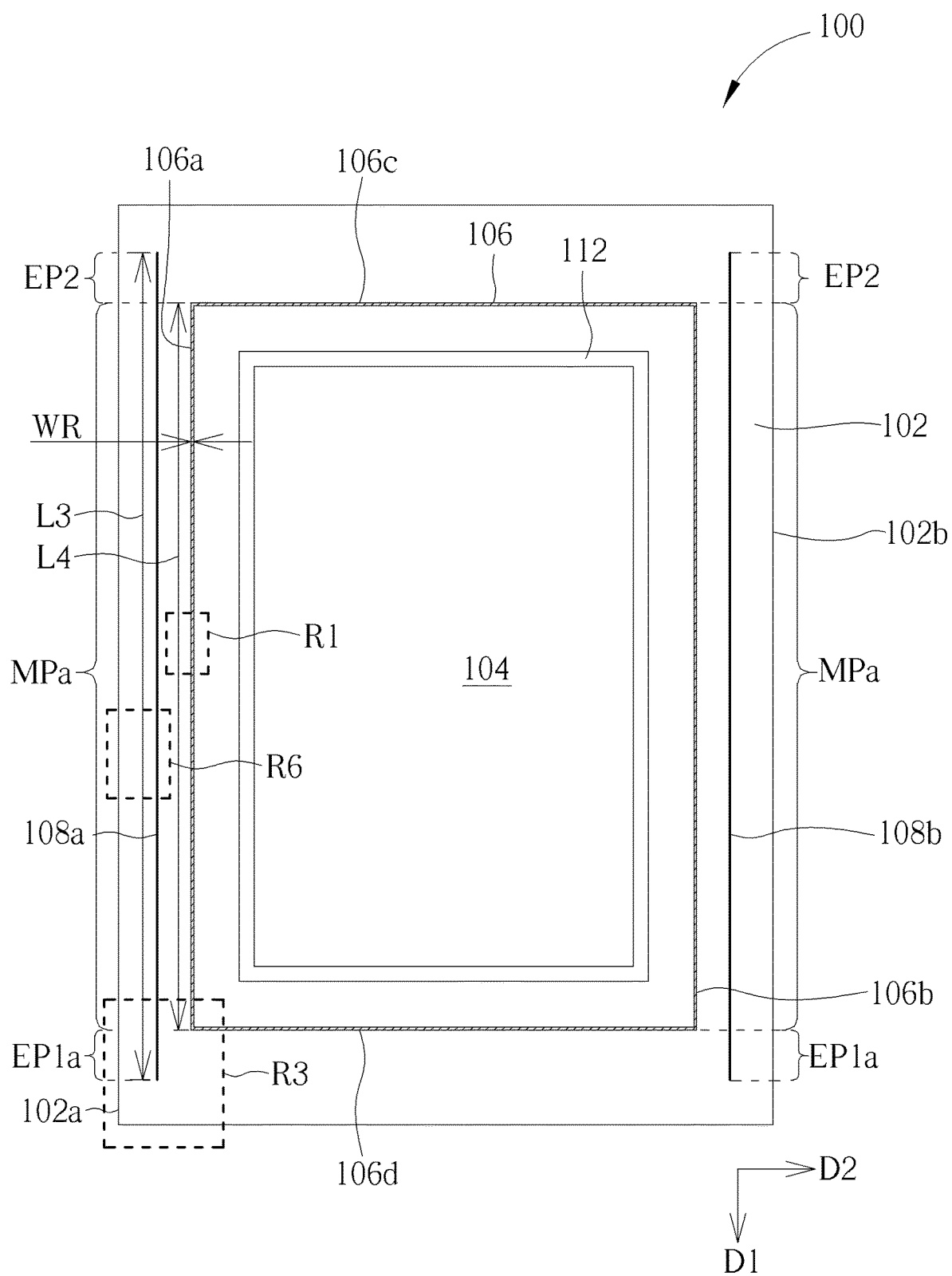
FIG. 2 is a schematic diagram illustrating a top view of an exemplary photomask with electrostatic discharge (ESD) protection according to a first embodiment of the present invention.

Refer to FIG. 2, which is a schematic diagram illustrating a top view of an exemplary photomask with electrostatic discharge (ESD) protection according to an embodiment of the present invention. As shown in FIG. 2, the photomask 100 includes a substrate 102 and a circuit pattern 104. The substrate 102 may be used for supporting the circuit pattern 104, an ESD structure 106 and an ESD line 108a, and be a transparent substrate, such that light may penetrating through the substrate 102. In some embodiments, the substrate 102 may include insulating support material, such as glass, quartz, sapphire or other suitable material, but not limited thereto. In some embodiments, extra transparent insulating material may be formed on the substrate 102. Also, in some embodiments, the shape of the substrate 102 may be depended on the required shape of the photomask 100. For example, the substrate 102 may be rectangular or other suitable shape. In this embodiment, the substrate 102 is rectangular as an example, but not limited thereto. The substrate 102 may have a first edge 102a and a second edge 102b opposite to each other, and the first edge 102a and the second edge 102b may be for example the edges where a mask holder contacts during particle inspection.

The circuit pattern 104 is disposed on the substrate 102 and used to be transferred to a photoresist on a wafer. The circuit pattern 104 may be designed according to elements or a semiconductor device to be formed by using the photomask 100, so the circuit pattern 104 may include a suitable layout pattern of one step of the processes for manufacturing the semiconductor device or elements. In FIG. 2, a region of the circuit pattern 104 is shown, and the shape of the circuit pattern 104 is not limited thereto.

In order to transfer the circuit pattern 104 onto the photoresist, the circuit pattern 104 include light-shielding material for shielding light irradiating the photomask 100. In the present disclosure, the light-shielding material of the circuit pattern 104 includes a conductive material. For example, the conductive material may include chromium, molybdenum, tungsten, aluminum, nickel, or chromium compound (e.g. chrome), but not limited thereto. In some embodiments, the photomask 100 may be a binary photomask. Since the circuit pattern 104 is conductive, in order not to accumulate electric charges on the circuit pattern 104, the photomask 100 further includes the ESD structure 106 and the ESD line 108a for ESD protection of the circuit pattern 104.

In one embodiment, the ESD structure 106 is disposed on the substrate 102 and at least partially surrounds the circuit pattern 104, for example the ESD structure 106 fully surrounds the circuit pattern 104. The ESD structure 106 includes a conductive material, so the ESD structure 106 can be used to release or discharge electric charges that come from all edges of the substrate 102. Accordingly, the ESD structure 106 may provide a certain degree of ESD protection and reduce occurrence of ESD damage to the circuit pattern 104 inside the ESD structure 106. In some embodiments, the conductive material of the ESD structure 106 may include chromium, molybdenum, tungsten, aluminum, nickel, or chromium compound (e.g. chrome), but not limited thereto. In some embodiments, the ESD structure 106 and the circuit pattern 104 may be formed of the same layer. In some embodiments, the ESD structure 106 may be rectangular ring or a ring with another suitable shape. In this embodiment, the ESD structure 106 is rectangular as an example, but not limited thereto. In such situation, the ESD structure 106 may have a first edge 106a and a second edge 106b opposite to each other, and the first edge 106a and the second edge 106b may correspond to the first edge 102a and the second edge 102b of the substrate 102 respectively. For example, the extending direction of the first edge 106a of the ESD structure 106 may be straight and parallel to a first direction D1. In some embodiments, the extending direction of the first edge 106a of the ESD structure 106 may be determined based on the shape or disposition of the ESD structure 106. For example, the first edge 106a of the ESD structure 106 may be curved, but not limited thereto.

Figure 3:
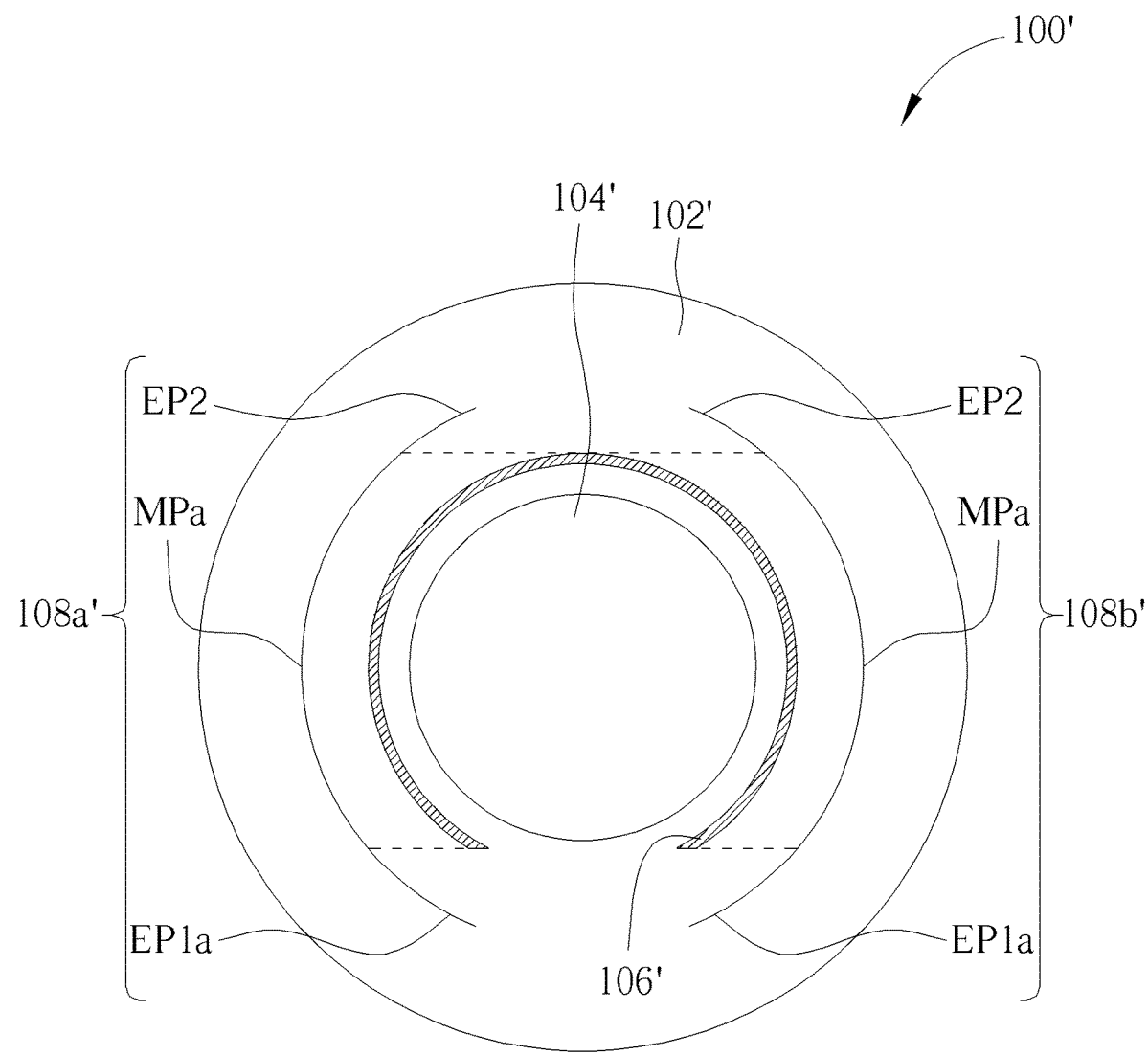
FIG. 3 is a schematic diagram illustrating a top view of another exemplary photomask with ESD protection according to some embodiments of the present invention.

Refer to FIG. 3, which is a schematic diagram illustrating a top view of another exemplary photomask 100' with ESD protection according to some embodiments of the present invention. In some embodiments, as shown in FIG. 3, the shape of the ESD structure 106' may be different from rectangle, such as circle-like shape, other geometric shape or any other shape. In some embodiments, the ESD structure may be a close structure. But in some other embodiments, the ESD structure 106' may not be a close ring structure, for example the ESD structure 106' may have at least one opening, so the ESD structure 106' partially surround the circuit pattern 104'. In some embodiments, the shape of the circuit pattern 104' may be different from rectangle, such as circular, other geometric shape or any other shape. In some embodiments, the shape of the substrate 102' may be different from rectangle, such as circular, other geometric shape or any other shape.

Figure 4:
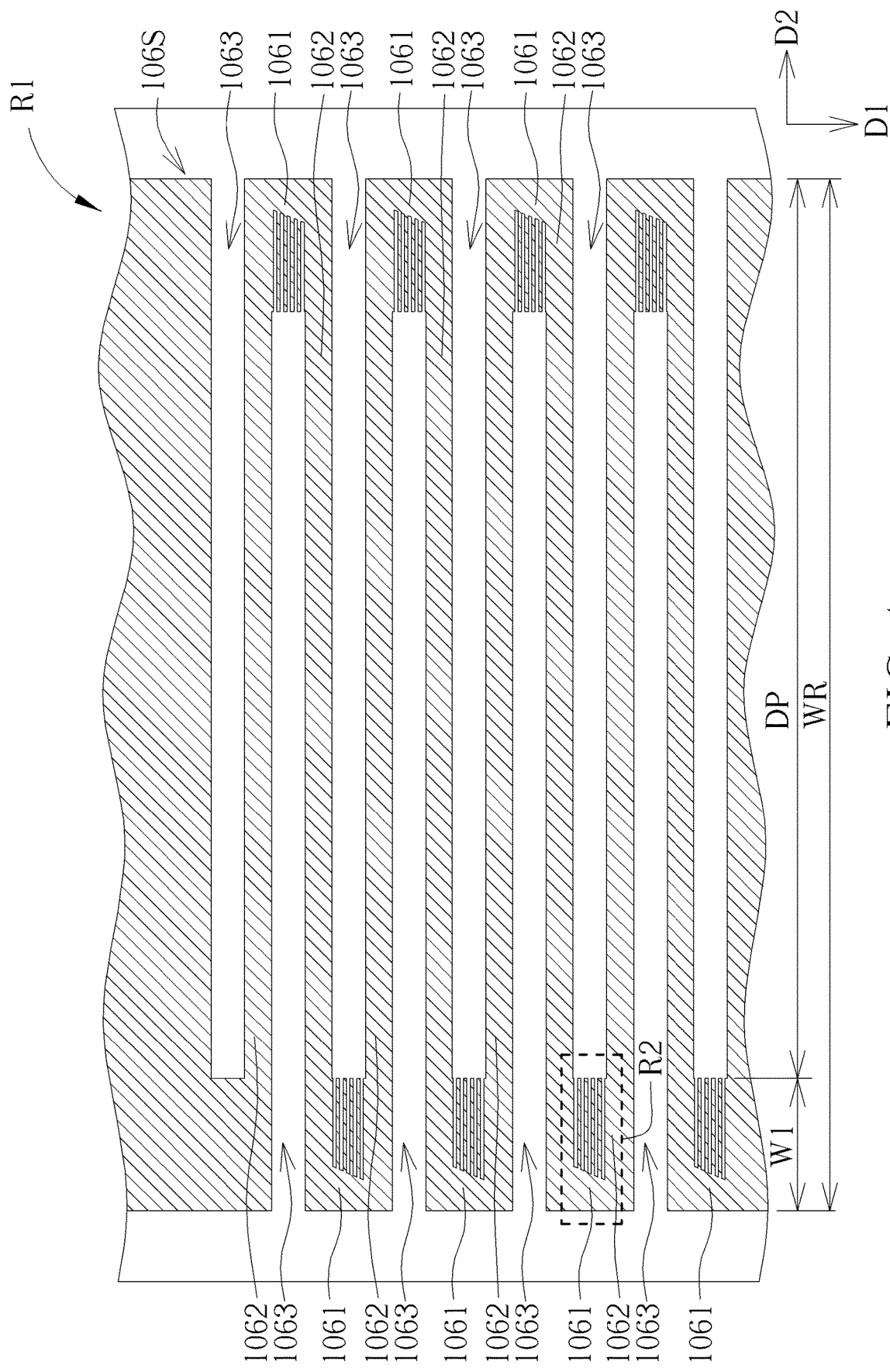
FIG. 4 illustrates an enlarged view of a region R1 surrounded by a dotted line shown in FIG. 2 according to some embodiments of the present invention.

Refer to FIG. 4, which illustrates an enlarged view of a region R1 surrounded by a dotted line shown in FIG. 2 according to some embodiments of the present invention. In some embodiments, the ESD structure 106 may include a serpentine segment 106S at the first side 106a, and the serpentine segment 106S may extend along a first direction D1. In some embodiments, the serpentine segment 106S may have a plurality of concavities 1063 arranged along the extending direction of the serpentine segment 106S, and adjacent two of the concavities 1063 may face opposite directions, for example face the first edge 102a and the second edge 102b respectively. In some embodiments, a width W1 of each comb-shaped structure 1061 may be much less than a depth DP of one of the concavities 1063 or much less than a width WR of the ESD structure 106 in a second direction D2. In some embodiments, the second direction D2 may perpendicular to the first direction D1.

In some embodiments, the serpentine segment 106S may include a plurality of comb-shaped structures 1061 for enhancing ESD protection. In such situation, the serpentine segment 106S may further include a plurality of segment parts 1062 for connecting the comb-shaped structures 1061, and each segment part 1062 and each comb-shaped structure 1061 are alternately connected in series. In some embodiments, the serpentine segment 106S may not include the comb-shaped structures.

Figure 5:
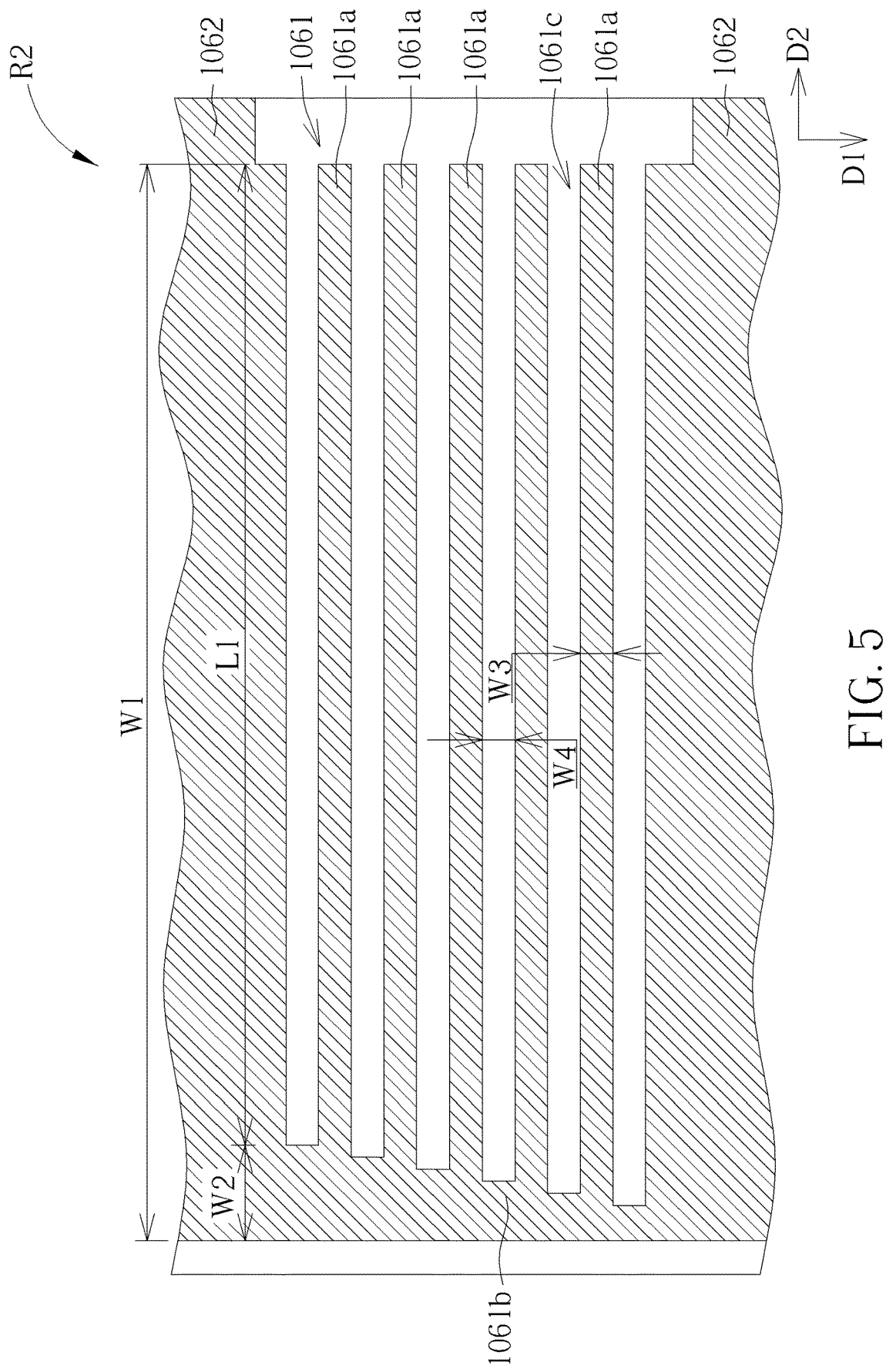
FIG. 5 illustrates an enlarged view of a region R2 of a comb-shaped structure surrounded by a dotted line shown in FIG. 4 according to some embodiments of the present invention.

In detail, refer to FIG. 5, which illustrates an enlarged view of a region R2 of a comb-shaped structure surrounded by a dotted line shown in FIG. 4 according to some embodiments of the present invention. For clarity, FIG. 5 shows one of the comb-shaped structures 1061, but the present invention is not limited thereto. In some embodiments, as shown in FIG. 5, the comb-shaped structure 1061 may include at least two pins 1061a and a connecting part 1061b, in which the pins 1061a are connected to and protrude from one side of the connecting part 1061b, and the pins 1061a are separated from each other. In some embodiment, the pins 1061a of the comb-shaped structure 1061 may point toward one of the concavities 1063. In other words, while one end of each pin 1061a is connected to the connecting part 1061b, the other end of each pin 1061a is not connected to any other part of the ESD structure 106 and points towards the corresponding concavity 1063. The comb-shaped structure 1061 may include a plurality of concavities 1061c, and each concavity 1061c is between adjacent two of the pins 1061a or between the pins 1061a and one of the segment parts 1062. In some embodiments, the width W1 of each comb-shaped structure 1061 in the second direction D2 (which is a sum of a length L1 of one pin 1061a and a width W2 of one connecting part 1062) may be much greater than a width W3 of each pin 1061a and/or much greater than a width W4 of each concavity 1061c, for example, the width W1 may be 50 μm, the width W3 may be 1.5 μm, and the width W4 may be 1.5 μm. In some embodiments, the width W2 of connecting part 1062 may not be uniform, and the closer to one of the segment parts 1062 the connecting part 1062 is, the wider the width W2 is. In some embodiments, the width W2 of connecting part 1062 may be uniform. In some embodiments, the number of the pins 1061a of the comb-shaped structure 1061 may be equal to or greater than 2.

As shown in FIG. 2, in some embodiments, the ESD structure 106 may further include another serpentine segment with comb-shaped structures at the second edge 106b, and parts of the ESD structure 106 at a third edge 106c and a fourth edge 106d may be uniform line segments. In some embodiments, the ESD structure 106 may also include serpentine segments with comb-shaped structures at the third edge 106c and the fourth edge 106d.

Since the mask holder or operator may frequently contact the first edge 102a and/or the second edge 102b of the substrate 102, more static electricity may be introduced from the first edge 102a and/or the second edge 102b. Accordingly, the ESD protection of the ESD structure 106 corresponding to the first edge 102a and/or the second edge 102b is not enough. In the present disclosure, by means of further disposing the ESD line 108a between the ESD structure 106 and a first edge 102a of the substrate 102, more electric charges from the first edge 102a and/or the second edge 102b may be discharged.

Figure 8:
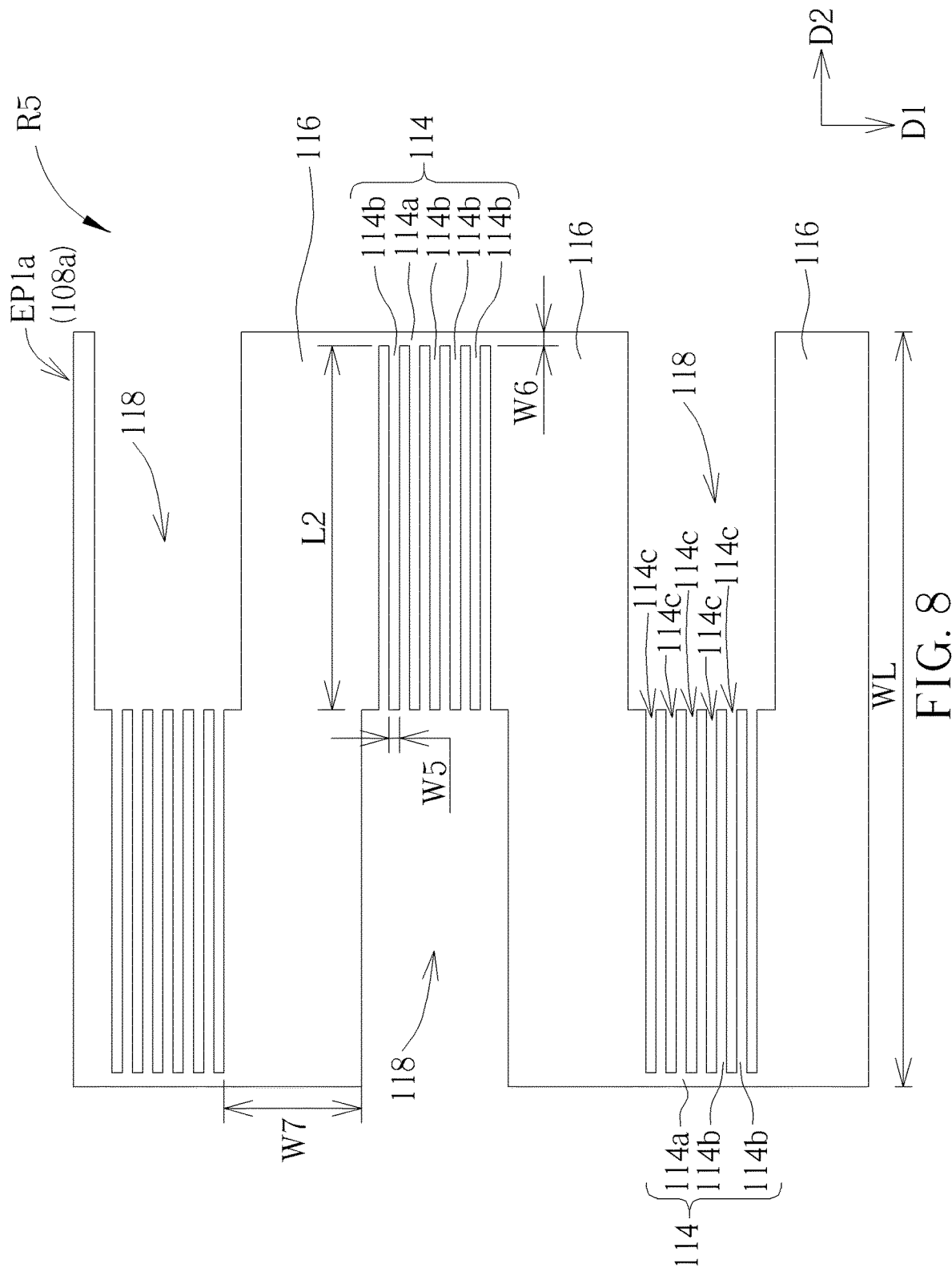
FIG. 8 illustrates an enlarged view of a region R5 shown in FIG. 7.

Refer to FIG. 2 again. In one embodiment, the ESD line 108a is disposed on the substrate 102 and extends between the first edge 102a of the substrate 102 and the first edge 106a of the ESD structure 106. The circuit pattern 104, the ESD structure 106 and the ESD line 108a are formed on a same surface of the substrate 102, and the ESD structure 106 disposed between the ESD line 108a and the circuit pattern 104 is separated from the ESD line 108a and the circuit pattern 104, so the electric charges on the ESD line 108a and the ESD structure 106 will not be conducted to the circuit pattern 104. The ESD line 108a includes a conductive material. In some embodiments, the conductive material may include chromium, molybdenum, tungsten, aluminum, nickel, or chromium compound (e.g. chrome), but not limited thereto. In some embodiments, the ESD line 108a, the ESD structure 106 and the circuit pattern 104 may be formed of the same layer. Since the ESD line 108a is disposed adjacent to the first edge 102a, the ESD line 108a can also be used for releasing or discharging electric charges from the first edge 102a, for example from the contact of the mask holder or the operator with the first edge 102a. In some embodiments, the width WL of the ESD line 108a (as shown in FIG. 8) may be less than the width WR of the ESD structure 106. For example, the width WL may be in a range from 30 μm to 180 μm. But in some embodiments, the width WL of the ESD line 108 may be more than the width WR of the ESD structure 106. In some embodiments, the shape of the ESD line 108a' may be curve instead of straight, as shown in FIG. 3. In some embodiments, the shape of the ESD line 108a' may be other geometric shape or any other shape.

In one embodiment, the ESD line 108a includes an edge portion EP1a beyond an end of the first edge 106a of the ESD structure 106 along an extending direction of the first edge 106a of the ESD structure 106. That is to say, the edge portion EP1a of the ESD line 108a exceeds the first edge 106a of the ESD structure 106. In some embodiments, an extending direction of the ESD line 108a may be parallel to the first direction D1. In some embodiments, the extending direction of the ESD line 108a may not be parallel to the extending direction of the first edge 106a of the ESD structure 106. In such situation, the edge portion EP1a may be defined as a portion that exceeds the first edge 106a of the ESD structure 106 when the ESD line 108a is projected onto the first edge 106a along a direction perpendicular to the first edge 106a, but the present invention is not limited thereto.

Figure 7:
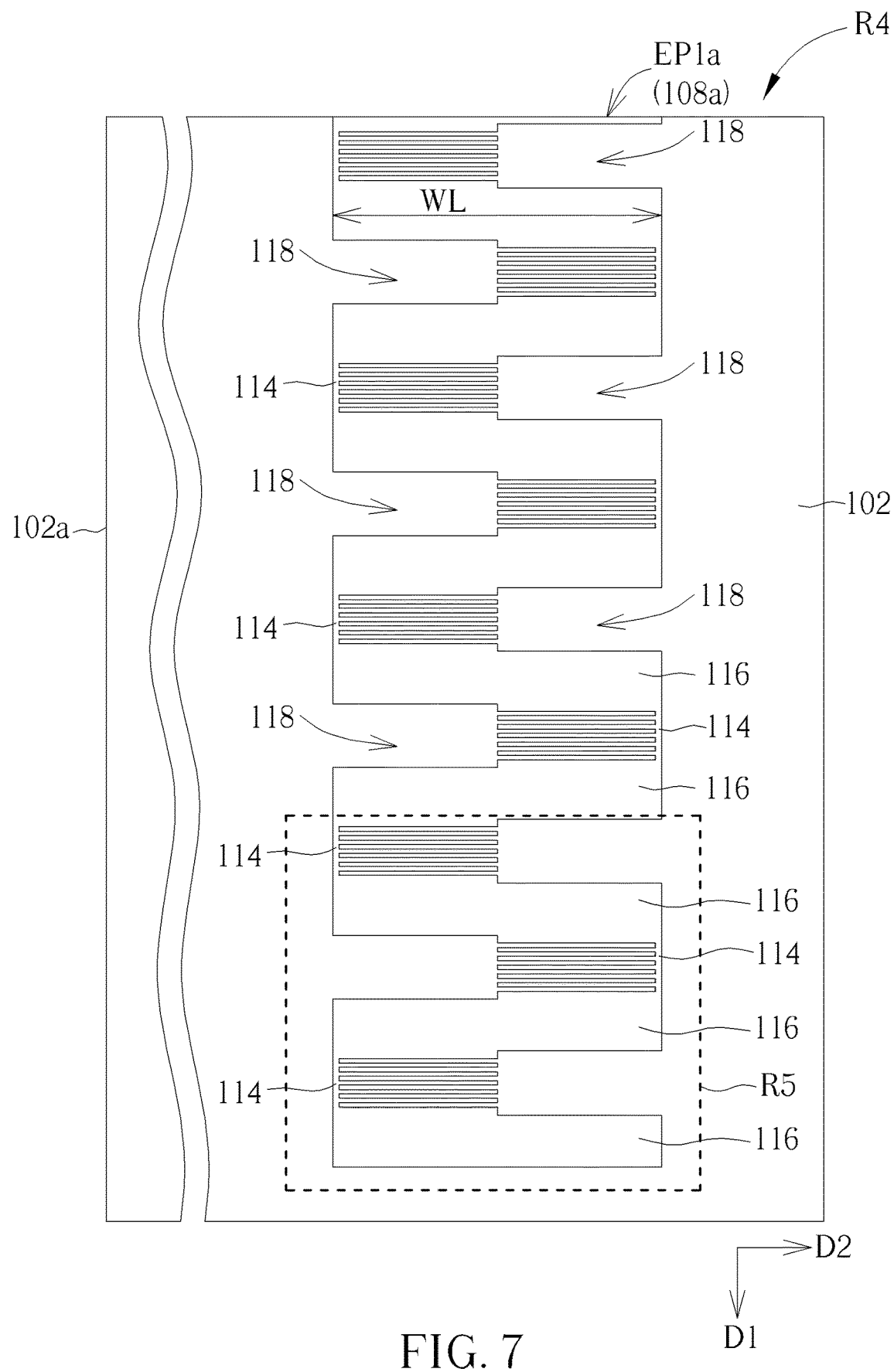
FIG. 7 illustrates an enlarged view of a region R4 shown in FIG. 6.

In one embodiment, the edge portion EP1a includes at least one comb-shaped structure (as shown in FIG. 7 and FIG. 8) for discharging the electric charges, so the electric charges can be discharged at the edge portion EP1a that is beyond the end of the first edge 106a of the ESD structure 106, i.e. the electric charges may be discharged away from the circuit pattern 104, thereby reducing the ESD affect to the circuit pattern 104.

Figure 6:
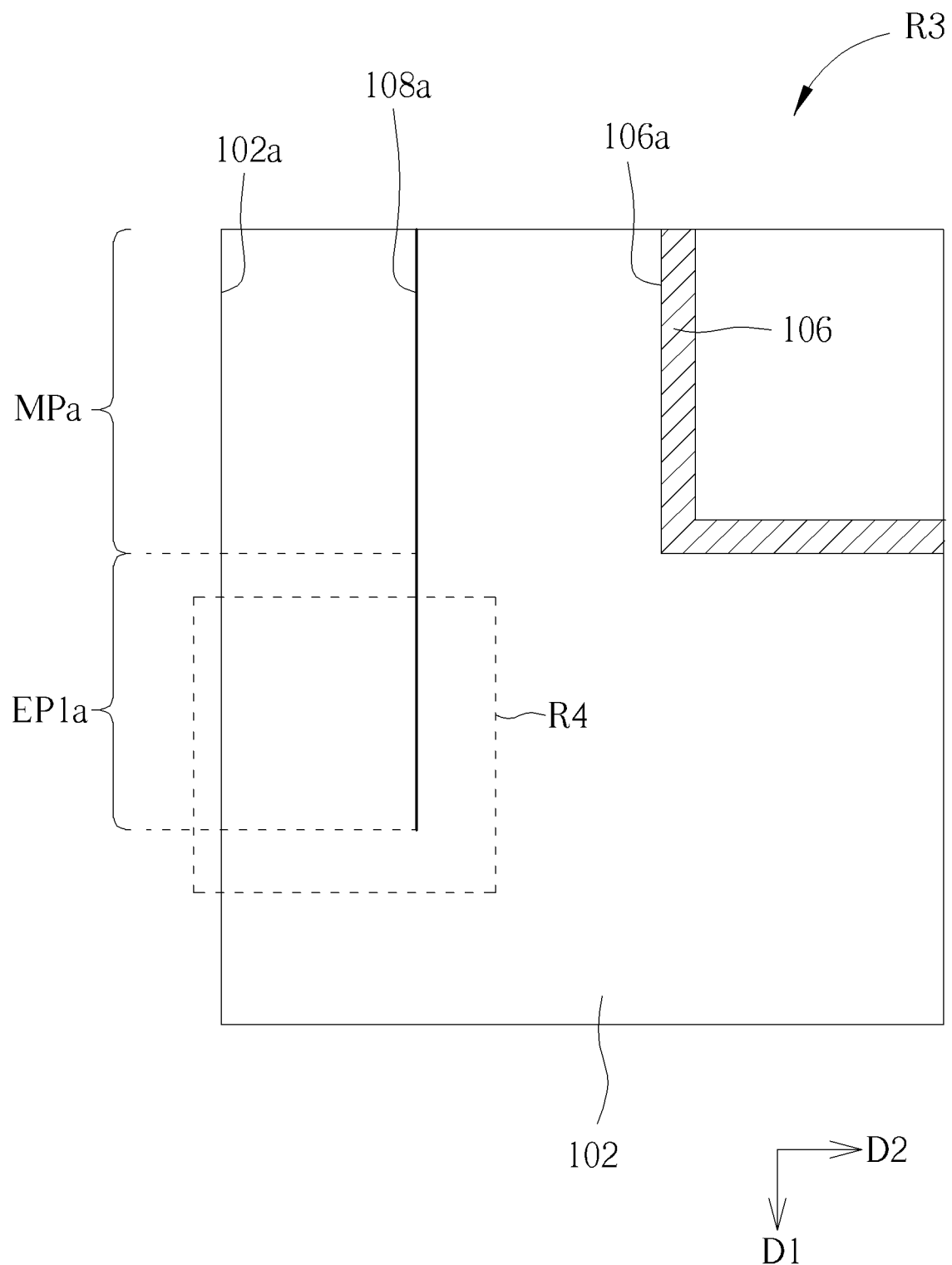
FIG. 6 illustrates an enlarged view of a region R3 shown in FIG. 2.

In detail, FIG. 6 illustrates an enlarged view of a region R3 shown in FIG. 2, FIG. 7 illustrates an enlarged view of a region R4 shown in FIG. 6, and FIG. 8 illustrates an enlarged view of a region R5 shown in FIG. 7. As shown in FIG. 6, FIG. 7 and FIG. 8, the edge portion EP1a of this embodiment may include a plurality of comb-shaped structures 114 for discharging the electric charges that accumulate on the ESD line 108a. In some embodiments, the number of the comb-shaped structures 114 may be one or more than one. In one embodiment, similar to the comb-shaped structure 1061 of the ESD structure 106, each comb-shaped structure 114 may include a connecting part 114a and at least two pins 114b connected to and protruded from one edge of the connecting part 114a, and the connecting part 114a is connected between one end of each pin 114b and other portions of the ESD line 108a. The pins 114b are separated from each other. The comb-shaped structure 114 may include a plurality of concavities 114c, and each concavity 114c is between adjacent two of the pins 114b. Since a width W5 of each pin 114b is small, ends of the pins 114b that are not connected to the connecting part 114a are regarded as points compared with other parts of the ESD line 108a. Accordingly, the electric charges at the ends of the pins 114b may result higher electric field than the electric charges on other parts of the ESD line 108a, and the electric charges on the ESD line 108a may be easily released and discharged from the ends of the pins 114b that are not connected to the connecting part 114a. For example, the method for discharging the electric charges may be arc discharge or corona discharge. With the design of the comb-shaped structures 114, the electric charges from the frequent contact of the mask holder or the operator with the first edge 102a can first accumulate on the ESD line 108a and then be discharged by the comb-shaped structures 114 that is at the edge portion EP1a beyond the end of the first edge 106a of the ESD structure 106. In some embodiments, the width W5 of each pin 114b is much less than a length L2 of each pin 114b. In some embodiments, the width W5 of each pin 114b may be equal to a width of each concavity 114c in the first direction D1. In some embodiments, a width W6 of the connecting part 114a in the second direction D2 may be much less than the length L2 of each pin 114b and much less than a width WL of the ESD line 108a in the second direction D2. In some embodiments, the width WL of the ESD line 108a may be greater than the length L2 of each pin 114b. The second direction D2 may be perpendicular to the extending direction of the ESD line 108a (e.g. the first direction D1). In some embodiments, the number of the pins 114b of the comb-shaped structure 114 may be equal to or greater than 2.

In some embodiments, the edge portion EP1a may further include a plurality of segments 116, and each segment 116 and each comb-shaped structure 114 are connected alternately to form a serpentine segment. In some embodiments, the serpentine segment may have a plurality of concavities 118 arranged along the extending direction of the ESD line 108a, such as the first direction D1, the pins 114b of one of the comb-shaped structures 114 may point towards corresponding one of the concavities 118, and the concavities 114c of each comb-shaped structure 114 may be connected to the corresponding concavity 118. It is noted that since the ends of the pins 114b that are not connected to the corresponding connecting part 114a are not protruded out of the concavity 118, the point discharge of the electric charges from these ends of the pins 114b can occur inside the concavities 118 and be prevented from damaging the ESD structure 106 adjacent to the ESD line 108a. For example, since the electric charges are discharged inside the concavities 118, the discharging effect on the ESD structure 106 can be reduced even though some of the pins 114b point toward the second edge 102b. In some embodiments, the width W5 of each pin 114b is less than a width W7 of each segment 116 in the first direction D1. In some embodiments, a width of the segment 116 in the second direction D2 may be equal to the width WL of the ESD line 108a. Since that, electric charges on one of the segments 116 may be introduced to adjacent one of the comb-shaped structure 114 to be discharged.

In some embodiments, the pins 114b in adjacent two of the comb-shaped structures 114 may point or protrude toward opposite directions, such as the second direction D2 and a direction opposite to the second direction D2. In some embodiments, the number of the pins 114b of one of the comb-shaped structures 114 that protrude toward the first edge 102a of the substrate 102 may be different from the number of the pins 114b of adjacent one of the comb-shaped structures 114 that protrude toward the second edge 102b of the substrate 102. For example, the number of the pins 114b protruding toward the first edge 102a may be greater than the number of the pins 114b protruding toward the second edge 102b, so that more electric charges may be discharged toward a direction away from the ESD structure 106 and the circuit pattern 104, thereby reducing the ESD effect on the ESD structure 106 and the circuit pattern 104.

Refer to FIG. 2 again. In some embodiments, the ESD line 108a may further include a main portion MPa and another edge portion EP2, the main portion MPa is connected between the edge portions EP1a, EP2, and the another edge portion EP2 is disposed beyond another end of the first edge 106a of the ESD structure 106 along the extending direction of the first edge 106a of the ESD structure 106. In other words, the main portion MPa between the edge portions EP1a, EP2 may have the same length as the first edge 106a of the ESD structure 106 along the first direction D1, and thus, a length L3 of the ESD line 108a in the first direction D1 can be greater than a length L4 of the first edge 106a of the ESD structure 106 in the first direction D1. In some embodiments, the ESD line 108a is not limited to include both of the edge portions EP1a, EP2, and the ESD line 108a may include the main portion MPa and one of the edge portions EP1a, EP2. In some embodiments, the another edge portion EP2 may be symmetric to the edge portion EP1a with respect to the main portion MPa or have the same structure as the edge portion EP1a, so as to include the comb-shaped structures 114 and segments 116 (as shown in FIG. 7 and FIG. 8). In some embodiments, the another edge portion EP2 may include at least one comb-shaped structure 114.

Figure 9:
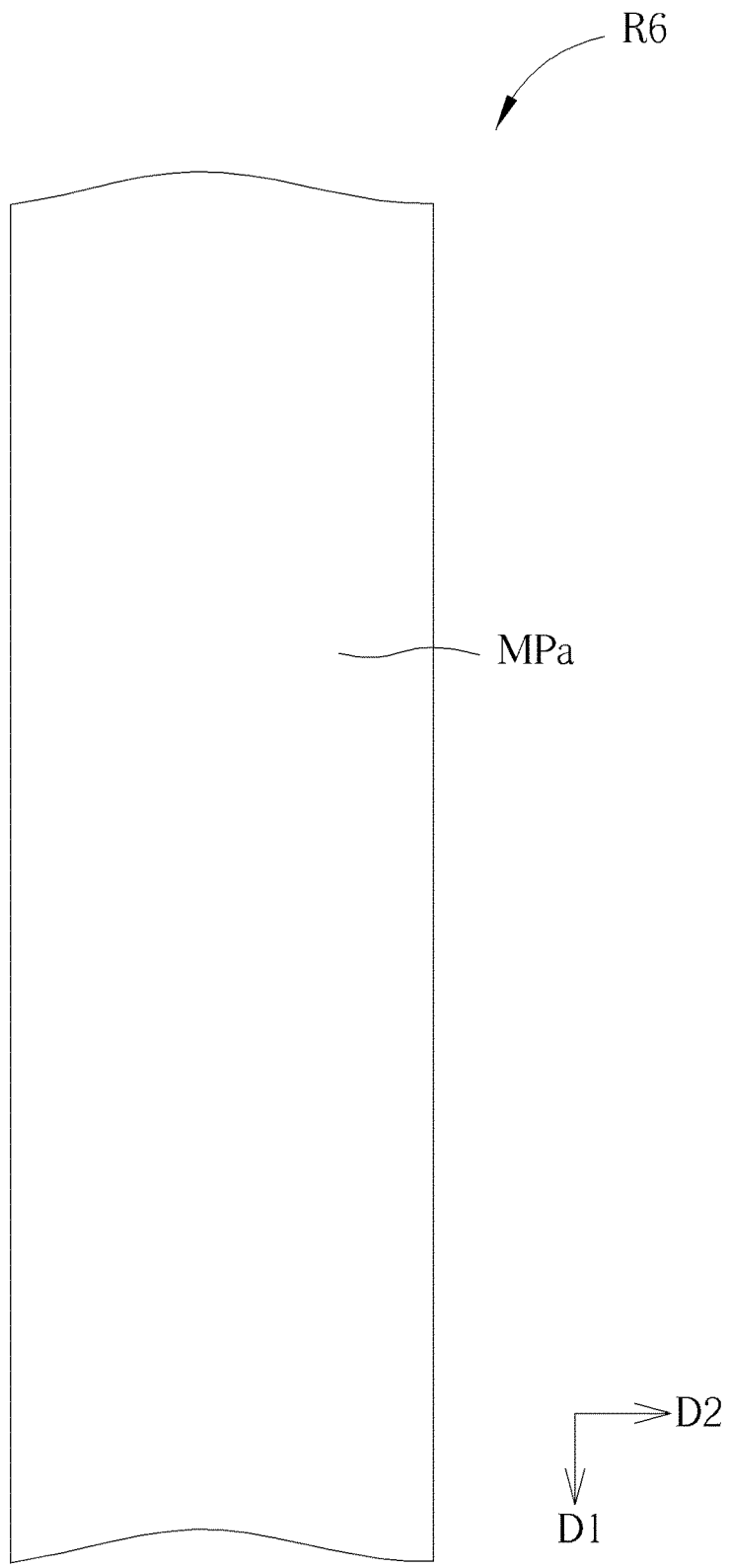
FIG. 9 illustrates an enlarged view of a region R6 shown in FIG. 2.

FIG. 9 illustrates an enlarged view of a region R6 of the main portion MPa surrounded by a dotted line FIG. 2. Refer to FIG. 9 together with FIG. 2. In one embodiment, the main portion MPa of the ESD line 108a connected between the edge portions EP1a, EP2 may be a line segment without comb-shaped structures. In some embodiments, the line segment may be a straight line with uniform width, and the width of the main portion MPa may be equal to the width of the edge portions EP1a, EP2, such as the width WL. In some embodiments, of the main portion MPa may be different from the width of the edge portions EP1a, EP2.

Refer to FIG. 2 again, in some embodiments, the photomask 100 may further include another ESD line 108b on the substrate 102 and disposed at a side of the ESD structure 106 corresponding to the second edge 106b. In other words, the ESD line 108b extends between the second edge 106b and the second edge 102b of the substrate 102. In some embodiments, the extending direction of the ESD line 108b may be parallel to the first direction D1. The ESD line 108b also include a conductive material, so the ESD line 108b can be used for releasing or discharging electric charges that accumulate for example from the contact of the mask holder or the operator with the second edge 102b. In some embodiments, the conductive material of the ESD line 108b may include chromium, molybdenum, tungsten, aluminum, nickel, or chromium compound (e.g. chrome), but not limited thereto. In some embodiments, the conductive material of ESD line 108b may be the same as the conductive material of the ESD line 108a. In some embodiments, the ESD line 108b may have the same structure as the ESD line 108a or be symmetrical to the ESD line 108a with respect to the circuit pattern 104, but not limited thereto. In some embodiments, the ESD line 108b may also include the main portion MPa and at least one of the edge portions EP1a, EP2. In some embodiments, the shape of the ESD line 108b' may be curve instead of straight, as shown in FIG. 3. In some embodiments, the shape of the ESD line 108b' may be other geometric shape or any other shape.

Refer to FIG. 2 again, in some embodiments, the photomask 100 may further include a scribe lane 112 for defining an area of the circuit pattern 104, so the scribe lane 112 surrounds the circuit pattern 104. In some embodiments, the circuit pattern 104 may include a plurality of pattern regions (not shown), and the photomask 100 may include scribe regions (not shown) for separating the pattern regions. The skilled in the related art may understand that the photomask 100 may further include other pattern, such as alignment marks.

It is noted that since the ESD line 108a is closer to the first edge 102a than the ESD structure 106 and/or the ESD line 108b is closer to the second edge 102b than the ESD structure 106, the electric charges transferred into the photomask 100 from the first edge 102a can first be introduced to the ESD line 108a, and the electric charges from the second edge 102b can first be introduced to the ESD line 108b. Also, because the ESD line 108a and/or the ESD line 108b include the comb-shaped structure 114 with the pins 114b at least at the edge portions EP1a, EP2, the electric charges may be further conducted and collected at the pins 114b, and then be released or discharged at the ends of the pins 114b before the electric charges enter the ESD structure 106 and the circuit pattern 104. Accordingly, by means of the design of the ESD line 108a and/or the ESD line 108b, the electric charges from the first edge 102a and the second edge 102b can be discharged when the electric charges are still far away from the circuit pattern 104 and the ESD structure 106, thereby prevent the electric charges from entering the ESD structure 106 and the circuit pattern 104. Also, since the edge portion EP1a and/or the edge portion EP2 of the ESD line 108a and/or the ESD line 108b include the comb-shaped structure 114, and the edge portion EP1a and the edge portion EP2 are disposed beyond the ends of the first edge 106a of the ESD structure 106, the ESD occurs at the pins 114b of the comb-shaped structure 114 can be away from the ESD structure 106 and the circuit pattern 104, thereby reducing the possibility of damage to the ESD structure 106 and the circuit pattern 104 by the ESD effect. Thus, the circuit pattern 104 can be totally protected and the shape of the circuit pattern 104 can be maintained during the manufacture of the required semiconductor devices, thereby ensuring every part of the circuit pattern 104 is accurate in size and shape.

The photomask of the present disclosure is not limited to the above embodiment. Further variant embodiments and embodiments of the present disclosure are described below. To compare the embodiments conveniently and simplify the description, the same component would be labeled with the same symbol in the following. The following description will detail the dissimilarities among different embodiments and the identical features will not be redundantly described.

Figure 10:
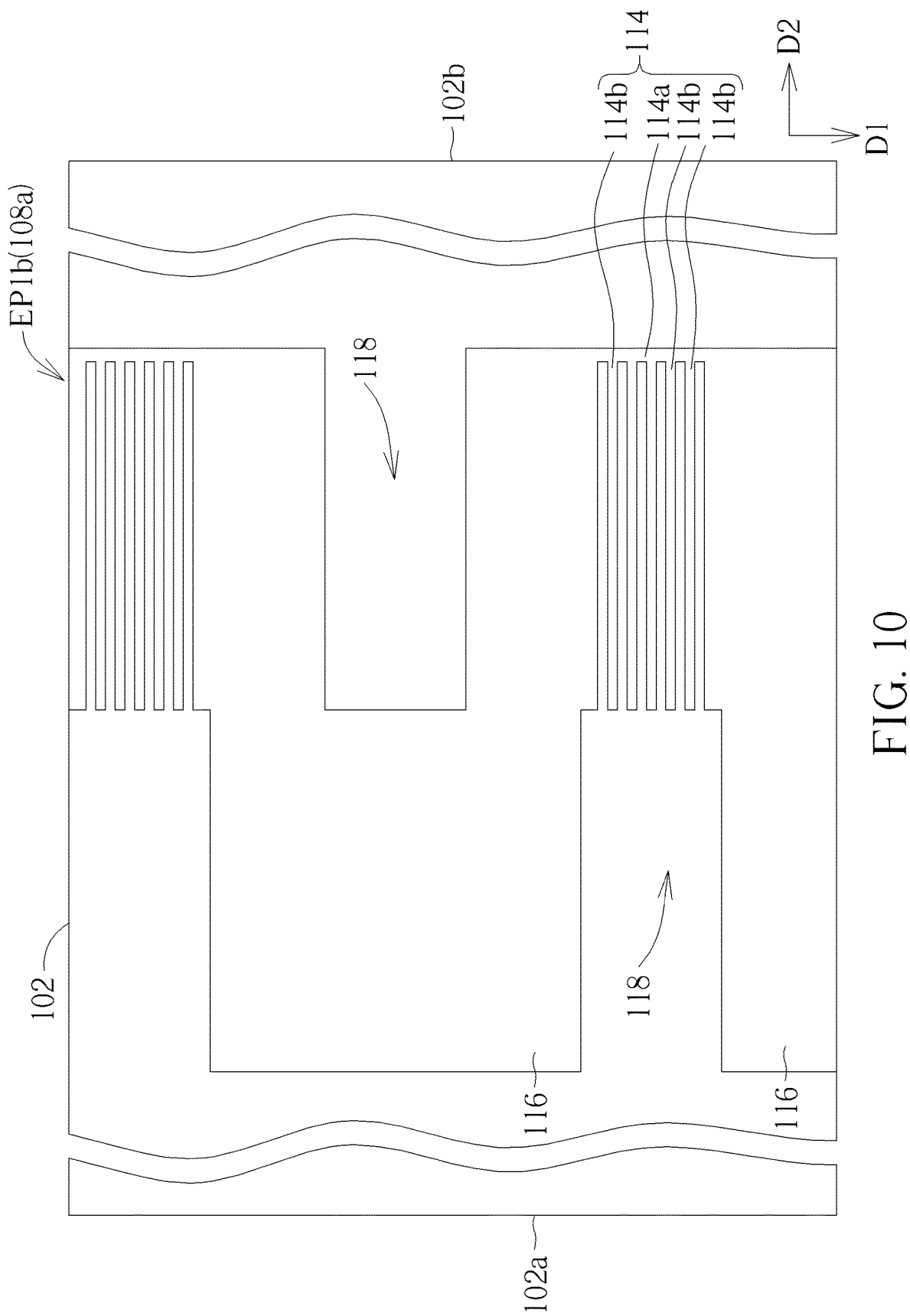
FIG. 10 illustrates a top view of an edge portion according to a first variant embodiment of the first embodiment of the present invention.

Refer to FIG. 10, which illustrates a top view of an edge portion according to a first variant embodiment of the first embodiment of the present invention. In this first variant embodiment, all the pins 114b of the edge portion EP1b of the ESD line 108a may protrude toward the first edge 102a, and the edge portion EP1b has no pins 114b protruding toward the second edge 102b, so as to further mitigate the ESD effect to the ESD structure 106 and the circuit pattern 104. In some embodiments, the edge portion EP2 of the ESD line 108a may have the same structure as the edge portion EP1b or symmetric to the edge portion EP1b. Similarly, in some embodiments, all the pins 114b of the edge portion EP1 and/or the edge portion EP2 of the ESD line 108b may protrude toward the second edge 102b or the first edge 102a, and the edge portion EP1 and/or the edge portion EP2 of the ESD line 108b has no pins 114b protruding toward the first edge 102a.

Figure 11:
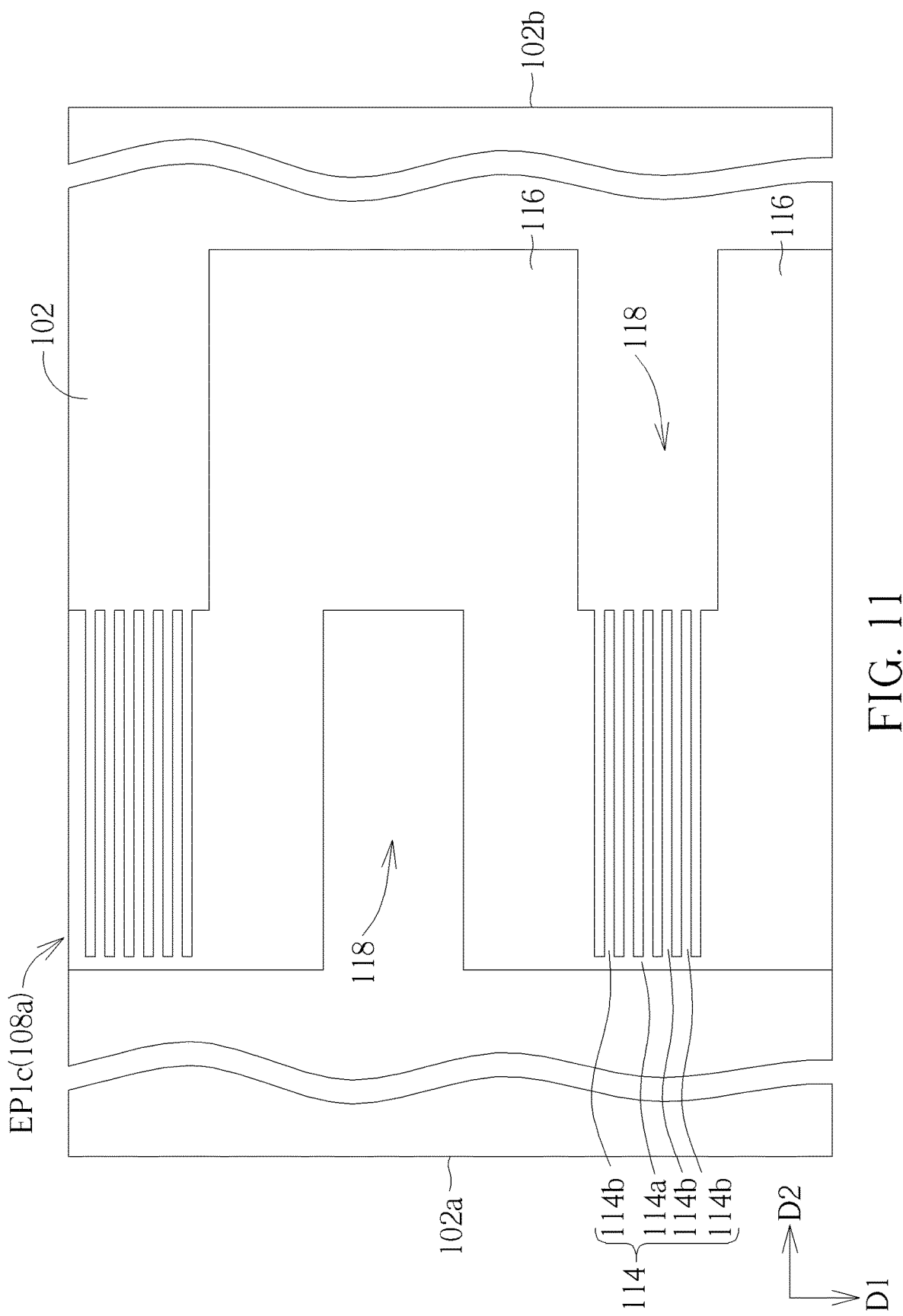
FIG. 11 illustrates a top view of an edge portion according to a second variant embodiment of the first embodiment of the present invention.

Refer to FIG. 11, which illustrates a top view of an edge portion according to a second variant embodiment of the first embodiment of the present invention. In this second variant embodiment, all the pins 114b of the edge portion EP1c of the ESD line 108a may protrude toward the second edge 102b, and the edge portion EP1c has no pins 114b protruding toward the first edge 102a. In some embodiments, the edge portion EP2 of the ESD line 108a may have the same structure as the edge portion EP1c or symmetric to the edge portion EP1c. Similarly, in some embodiments, all the pins 114b of the edge portion EP1 and/or the edge portion EP2 of the ESD line 108b may protrude toward the first edge 102a or the second edge 102b.

Figure 12:
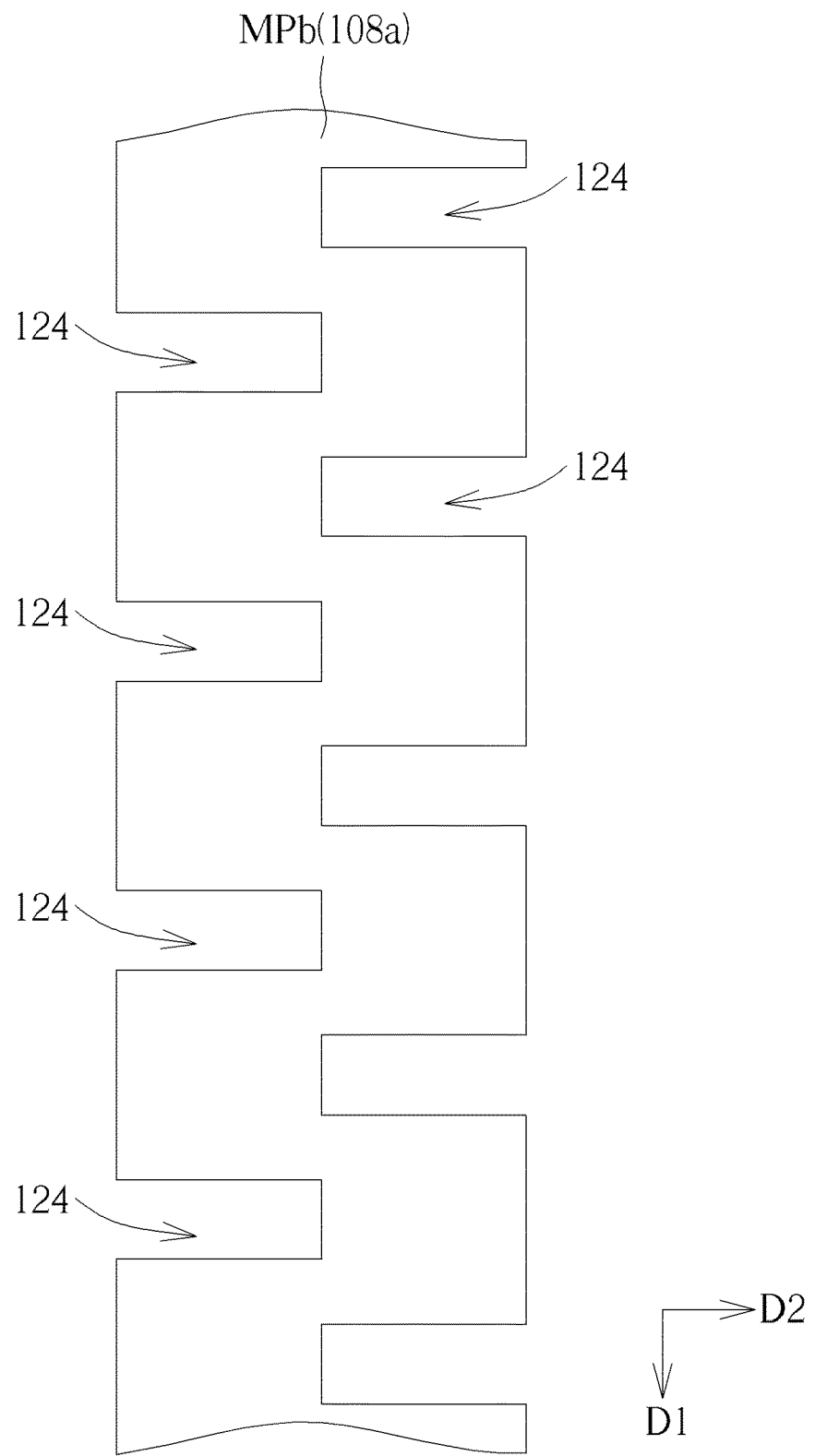
FIG. 12 illustrates a top view of a main portion according to a third variant embodiment of the first embodiment of the present invention.

Refer to FIG. 12, which illustrates a top view of a main portion according to a third variant embodiment of the first embodiment of the present invention. In this variant embodiment, the main portion MPb of the ESD line 108a may be a serpentine line segment without comb-shaped structures, in which the serpentine line segment is connected between the edge portions and include a plurality of concavities 124, and adjacent two of the concavities 124 face opposite directions. In some embodiments, the main portion of the ESD line 108b may also be a serpentine line segment without comb-shaped structures.

Figure 13:
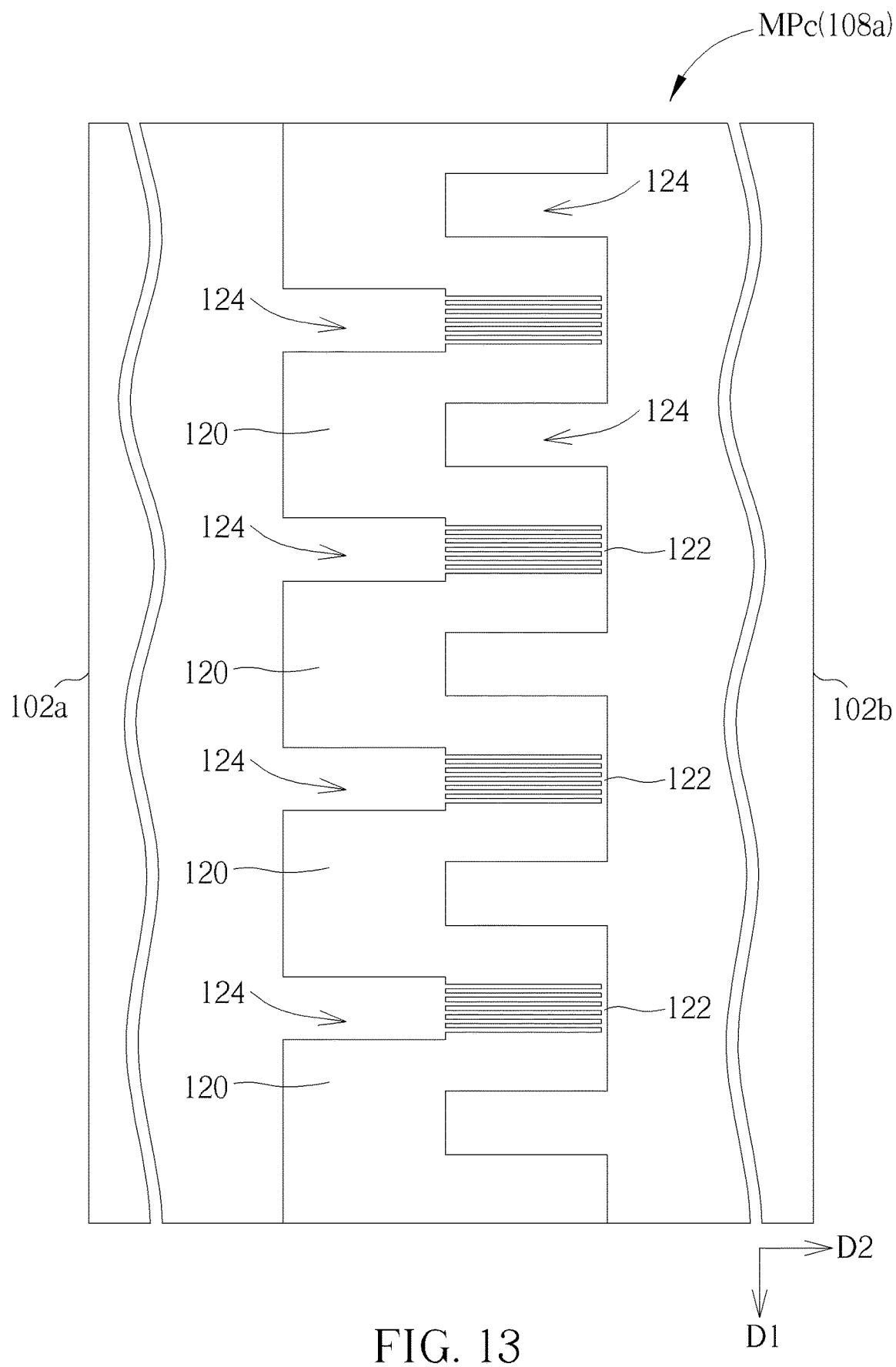
FIG. 13 illustrates a top view of a main portion according to a fourth variant embodiment of the first embodiment of the present invention.

Refer to FIG. 13, which illustrates a top view of a main portion according to a fourth variant embodiment of the first embodiment of the present invention. In this variant embodiment, the main portion MPc may include a plurality of segments 120 and a plurality of comb-shaped structures 122, and each segment 120 and each comb-shaped structure 122 are connected alternately to form a serpentine segment. The serpentine segment may have a plurality of concavities 124, and each comb-shaped structure 122 of the main portion MPc may include a connecting part 122a and at least two pins 122b protruded from the connecting part 122a to one of the concavities 124. In this variant embodiment, the pins 122b in adjacent two of the comb-shaped structures 122 may protrude toward the first edge 102a of the substrate 102, and there is no pins of the ESD line 108a protrude toward the second edge 102b of the substrate 102. In some embodiments, the main portion of the ESD line 108b may also include the segments 120 and the comb-shaped structures 122, the pins 122b in adjacent two of the comb-shaped structures 122 of the main portion of the ESD line 108b may protrude toward the second edge 102b of the substrate 102, and there is no pins of the ESD line 108b protrude toward the first edge 102b of the substrate 102.

Figure 14:
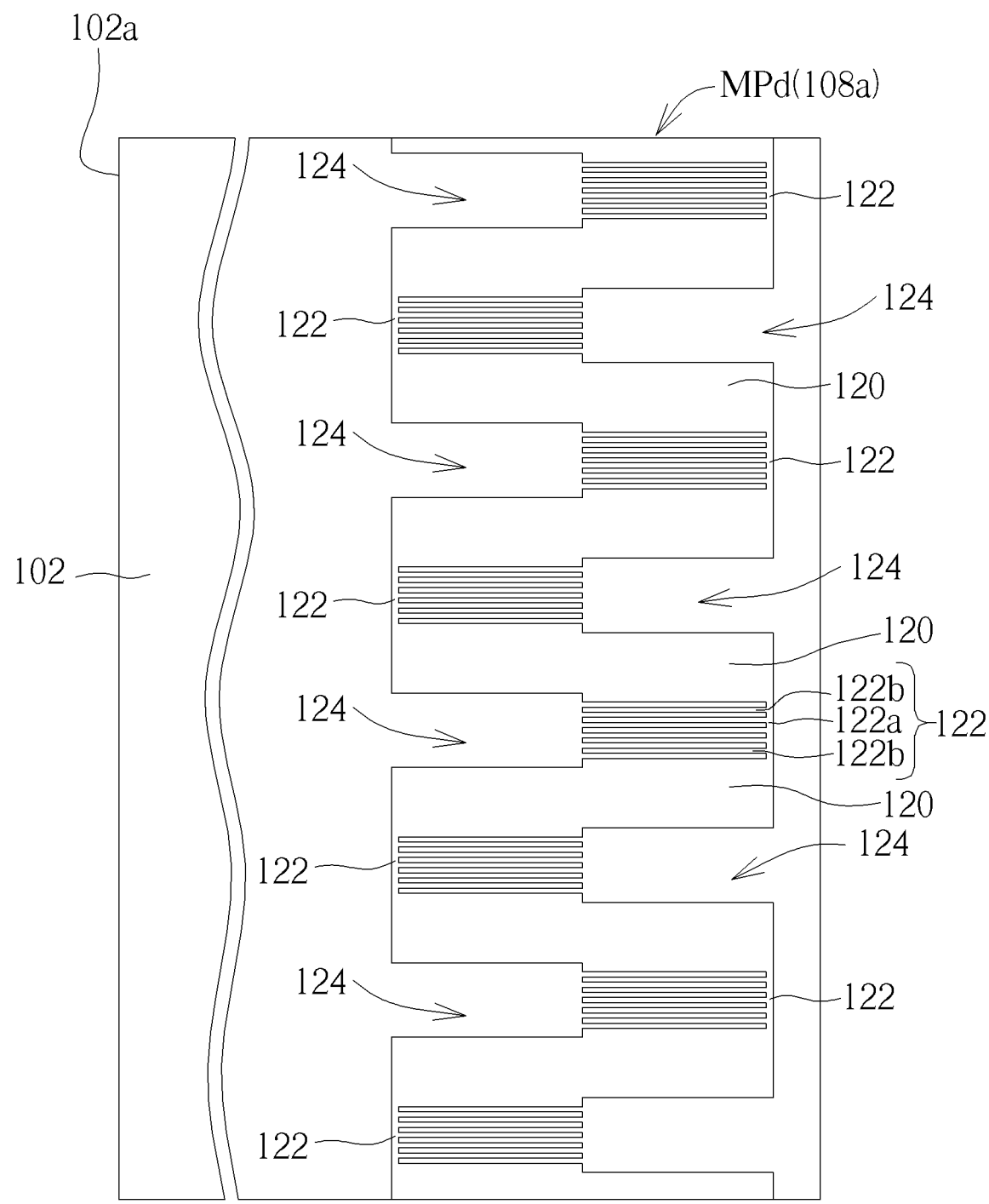
FIG. 14 illustrates a top view of a main portion according to fifth variant embodiment of the first embodiment of the present invention.

Refer to FIG. 14, which illustrates a top view of a main portion according to a fifth variant embodiment of the first embodiment of the present invention. In this variant embodiment, the main portion MPd may have the same structure as the edge portion EP1a as compared with the main portion MPa shown in FIG. 9. For example, the main portion MPd may include a plurality of segments 120 and a plurality of comb-shaped structures 122, and each segment 120 and each comb-shaped structure 122 are connected alternately to form a serpentine segment. The serpentine segment may have a plurality of concavities 124, and each comb-shaped structure 122 of the main portion MPd may include a connecting part 122a and at least two pins 122b protruded from the connecting part 122a to one of the concavities 124. In some embodiments, the pins 122b in adjacent two of the comb-shaped structures 122 may protrude toward opposite directions, such as the second direction D2 and a direction opposite to the second direction D2. In some embodiments, the main portion MPd and the edge portions EP1a, EP2 of the ESD line 108a may include the comb-shaped structures respectively. For example, the whole ESD line 108a consists of the segments and the comb-shaped structures or consists of the comb-shaped structures. In some embodiments, the pins 122b in adjacent two of the comb-shaped structures 122 of the main portion of the ESD line 108b may also protrude toward opposite directions. In some embodiments, the main portion MPd and the edge portions EP1a, EP2 of the ESD line 108b may include the comb-shaped structures respectively. For example, the whole ESD line 108b consists of the segments and the comb-shaped structures or consists of the comb-shaped structures.

Figure 15:
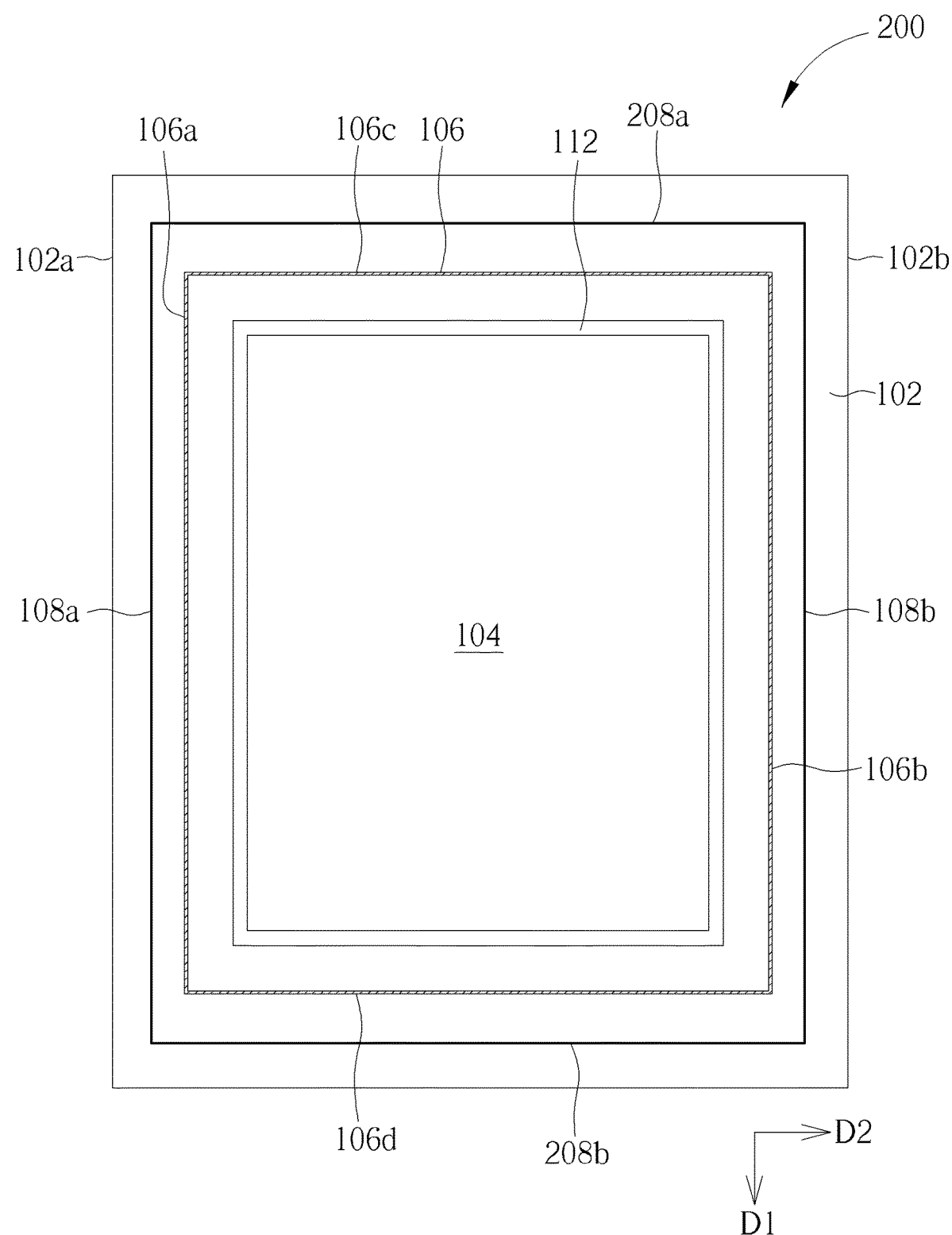
FIG. 15 is a schematic diagram illustrating a top view of an exemplary photomask with ESD protection according to a second embodiment of the present invention.

Refer to FIG. 15, which is a schematic diagram illustrating a top view of an exemplary photomask with ESD protection according to a second embodiment of the present invention. The photomask 200 provided in this embodiment is different from the first embodiment in that the photomask 200 further include two ESD lines 208a, 208b at two opposite sides of the ESD structure 106 corresponding to the third edge 106c and the fourth edge 106d, and the ESD lines 208a, 208b and the ESD lines 108a, 108b may surround the ESD structure 106. In some embodiments, the ESD lines 108a, 108b, 208a, 208b may be connected to form a ring around the ESD structure 106. In some embodiments, the edge portions and/or the main portion mentioned in above embodiment and/or above variant embodiments may be implemented in at least one of the ESD lines 208a, 208b.

It is advantageous to use the disclosed photomask because by means of the comb-shaped structure of the edge portion of the ESD line, the electric charges from the first edge and the second edge can be discharged when the electric charges are still far away from the circuit pattern and the ESD structure, thereby prevent the electric charges from entering the ESD structure and the circuit pattern. Therefore, the circuit pattern can be more efficiently protected from damage due to the ESD effect at least from the first edge and/or the second edge, and the shape of the circuit pattern can be maintained.

The foregoing description of the specific embodiments will so fully reveal the general nature of the present invention that others can, by applying knowledge within the skill of the art, readily modify and/or adapt, for various applications, such specific embodiments, without undue experimentation, and without departing from the general concept of the present invention. Therefore, such adaptations and modifications are intended to be within the meaning and range of equivalents of the disclosed embodiments, based on the invention and guidance presented herein. It is to be understood that the phraseology or terminology herein is for the purpose of description and not of limitation, such that the terminology or phraseology of the present specification is to be interpreted by the skilled artisan in light of the invention and guidance.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present invention as contemplated by the inventor(s), and thus, are not intended to limit the present invention and the appended claims in any way.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A photomask, comprising:
a substrate;
a circuit pattern on the substrate;
an electrostatic discharge (ESD) structure on the substrate, and the ESD structure surrounding the circuit pattern; and
an ESD line on the substrate, and the ESD line being disposed between an edge of the substrate and the ESD structure and extending along the edge of the substrate, wherein a length of the ESD line in an extending direction of the edge of the substrate is greater than a length of the ESD structure in the extending direction of the edge of the substrate, each of the ESD structure and the ESD line is conductive, and the ESD structure is electrically insulated from the ESD line, and
wherein the ESD line comprises an edge portion extending beyond an end of an edge of the ESD structure along the extending direction of the edge of the substrate, and the edge portion of the ESD line comprises at least one comb-shaped structure.

2. The photomask as claimed in claim 1, wherein the comb-shaped structure comprises a connecting part and at least two pins protruded from the connecting part.

3. The photomask as claimed in claim 2, wherein the edge portion of the ESD line is not overlapped with the ESD structure along an extending direction of each of the pins.

4. The photomask as claimed in claim 2, wherein one end of each of the pins is connected to the connecting part.

5. The photomask as claimed in claim 1, wherein the edge portion comprises a plurality of segments and a plurality of comb-shaped structures, each comb-shaped structure comprises a connecting part and at least two pins, and each segment and each connecting part are connected alternately to form a serpentine segment.

6. The photomask as claimed in claim 5, wherein the serpentine segment has a plurality of concavities, and the pins of one of the comb-shaped structure point toward one of the concavities.

7. The photomask as claimed in claim 5, wherein a width of each comb-shaped structure is greater than a length of each pin.

8. The photomask as claimed in claim 5, wherein the pins in adjacent two of the comb-shaped structures protrude toward opposite directions.

9. The photomask as claimed in claim 5, wherein the pins in adjacent two of the comb-shaped structures protrude toward the edge of the substrate.

10. The photomask as claimed in claim 1, wherein the ESD line further comprises a main portion and another edge portion, and the main portion and the another edge portion comprise a plurality of comb-shaped structures respectively.

11. The photomask as claimed in claim 1, wherein the ESD line further comprises a main portion and another edge portion, the main portion is connected between the edge portions, and the another edge portion is disposed beyond another end of the edge of the ESD structure.

12. The photomask as claimed in claim 11, wherein the main portion comprises a plurality of segments and a plurality of comb-shaped structures, and each segment and each comb-shaped structure of the main portion are connected alternately to form a serpentine segment.

13. The photomask as claimed in claim 12, wherein the serpentine segment has a plurality of concavities, and each comb-shaped structure of the main portion comprises a connecting part and at least two pins protruded from the connecting part to one of the concavities.

14. The photomask as claimed in claim 13, wherein the pins in adjacent two of the comb-shaped structures of the main portion protrude toward the edge of the substrate.

15. The photomask as claimed in claim 1, further comprising another ESD line disposed at a side of the ESD structure opposite to the edge.

16. The photomask as claimed in claim 15, further comprising another two ESD lines at two sides of the ESD structure, and the ESD lines surround the ESD structure.

17. The photomask as claimed in claim 1, wherein an extending direction of the ESD line is parallel to the extending direction of the edge of the ESD structure.

18. The photomask as claimed in claim 1, wherein the ESD structure comprises a plurality of comb-shaped structures.

19. The photomask as claimed in claim 1, wherein the substrate comprises an insulating support material.

\* \* \* \* \*